US012620865B2

(12) United States Patent
Suzuki et al.

(10) Patent No.: US 12,620,865 B2
(45) Date of Patent: May 5, 2026

(54) CIRCUIT CONNECTION APPARATUS, ELECTRIC ROTATING MACHINE APPARATUS AND MANUFACTURING METHOD FOR CIRCUIT CONNECTION APPARATUS

(71) Applicant: Mitsubishi Electric Corporation, Tokyo (JP)

(72) Inventors: Junya Suzuki, Tokyo (JP); Hideya Nishikawa, Tokyo (JP); Yoshihiko Onishi, Tokyo (JP); Isao Sonoda, Tokyo (JP); Takayuki Nakao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 318 days.

(21) Appl. No.: 18/269,688

(22) PCT Filed: Feb. 24, 2021

(86) PCT No.: PCT/JP2021/006749
§ 371 (c)(1),
(2) Date: Jun. 26, 2023

(87) PCT Pub. No.: WO2022/180660
PCT Pub. Date: Sep. 1, 2022

(65) Prior Publication Data
US 2024/0063685 A1      Feb. 22, 2024

(51) Int. Cl.
*H02K 5/22* (2006.01)
*H01R 12/58* (2011.01)
(Continued)

(52) U.S. Cl.
CPC ........... *H02K 5/225* (2013.01); *H01R 12/585* (2013.01); *H01R 43/205* (2013.01); *H02K 11/33* (2016.01);
(Continued)

(58) Field of Classification Search
CPC ........ H02K 5/225; H02K 11/33; H02K 15/32; H02K 2211/03; H01R 12/585; H01R 43/205; H05K 7/209
See application file for complete search history.

(56) References Cited

U.S. PATENT DOCUMENTS

| | | | |
|---|---|---|---|
| 6,171,133 B1 * | 1/2001 | Altuner | H01R 12/7005 439/79 |
| 6,780,026 B2 * | 8/2004 | Sato | H01R 9/226 439/76.2 |

(Continued)

FOREIGN PATENT DOCUMENTS

| | | | | |
|---|---|---|---|---|
| EP | 4459852 A1 * | 11/2024 | | H02K 5/225 |
| JP | 2004-354122 A | 12/2004 | | |

(Continued)

OTHER PUBLICATIONS

International Search Report for PCT/JP2021/006749 dated, Apr. 20, 2021 (PCT/ISA/210).

(Continued)

*Primary Examiner* — Jeremy A Luks
(74) *Attorney, Agent, or Firm* — Sughrue Mion, PLLC

(57) ABSTRACT
A circuit connection apparatus has a connector including a housing in which a connection terminal is contained, a positioning guide portion provided therein at an opposite side to an opening portion of the housing, and a press-fit terminal extended from the connection terminal. Moreover, the circuit connection apparatus has a heat sink that includes a guide receipt portion fitted with the positioning guide
(Continued)

portion—and an opening to be penetrated by the press-fit terminal and to which the housing is fixed. Furthermore, the circuit connection apparatus has a circuit board that includes a board positioning guide portion and a through-hole to which the press-fit terminal is pressure-bonded and that is fixed to the heat sink. Because the press-fit terminal and the through-hole can accurately be positioned, it is made possible that the reliability is raised and a simple assembly process suppresses the production cost from rising.

11 Claims, 12 Drawing Sheets

(51) Int. Cl.
|  |  |
|---|---|
| *H01R 43/20* | (2006.01) |
| *H02K 11/33* | (2016.01) |
| *H02K 15/32* | (2025.01) |
| *H05K 7/20* | (2006.01) |

(52) U.S. Cl.
CPC ............. *H02K 15/32* (2025.01); *H05K 7/209* (2013.01); *H02K 2211/03* (2013.01)

(56) References Cited

U.S. PATENT DOCUMENTS

| | | |
|---|---|---|
| 7,165,979 B1 | 1/2007 | Oka |
| 2013/0099611 A1 | 4/2013 | Suga et al. |
| 2014/0028161 A1 | 1/2014 | Kamogi |
| 2020/0195098 A1 | 6/2020 | Shimakawa et al. |
| 2022/0224195 A1 | 7/2022 | Matsuda |

FOREIGN PATENT DOCUMENTS

| | | | |
|---|---|---|---|
| JP | 2005-302614 A | 10/2005 |
| JP | 2007-28870 A | 2/2007 |
| JP | 2020-80643 A | 5/2020 |
| JP | 2020-195195 A | 12/2020 |

OTHER PUBLICATIONS

Japanese Office Action issued May 7, 2024 in Application No. 2023-501695.
Communication dated Mar. 14, 2024 issued by the European Patent Office in application No. 21927764.7.

* cited by examiner

CIRCUIT CONNECTION APPARATUS, ELECTRIC ROTATING MACHINE APPARATUS AND MANUFACTURING METHOD FOR CIRCUIT CONNECTION APPARATUS

CROSS REFERENCE TO RELATED APPLICATIONS

This application is a National Stage of International Application No. PCT/JP2021/006749 filed Feb. 24, 2021.

TECHNICAL FIELD

The present disclosure relates to a circuit connection apparatus, an electric rotating machine apparatus, and a manufacturing method for the circuit connection apparatus.

BACKGROUND ART

There exists a circuit connection apparatus to be connected with a through-hole of a circuit board, spaced a predetermined distance apart from the housing of an external connection connector. A circuit connection apparatus here means an apparatus in which a circuit board and an external connection connector are connected with each other in such a way that a terminal of the external connection connector is extended and is connected with a through-hole of the circuit board. For example, a circuit connection apparatus is utilized in a control unit for an electric rotating machine apparatus. Heat-generating components such as an inverter for controlling an electric rotating machine, a switching device utilized in a power-source circuit or the like, a shunt resistor, a microcontroller, and an IC are mounted on the circuit board in the control unit for the electric rotating machine apparatus. Accordingly, in many cases, the circuit board is adhered to a heat sink so as to be cooled and an external connection connector is connected with the circuit board in such a way that the heat sink is sandwiched between the circuit board and the external connection connector. In such cases, a terminal of a connector is connected from the housing of the connector to a through-hole of the circuit board via a predetermined space where the heat sink is provided.

A press-fit terminal may be utilized for connecting the connector with the through-hole of the circuit board. A press-fit terminal is a terminal to be inserted into the through-hole of the circuit board so that electric connection can be performed. Utilizing the press-fit terminal makes it possible to secure electric connection between the circuit board and the connector terminal without applying soldering. Accordingly, utilizing the press-fit terminal makes it possible to facilitate manufacturing of the circuit connection apparatus and hence shorten the manufacturing time. As a result, the cost of the circuit connection apparatus can be reduced.

There has been proposed a circuit connection apparatus to be connected with a through-hole of a circuit board, through a press-fit terminal and spaced a predetermined distance apart from the housing of an external connection connector. Because a predetermined distance is provided between the housing of a connector and a circuit board, the distance between the housing and the front end of the press-fit terminal becomes large; thus, there is posed a problem that it is difficult to insert the press-fit terminal into the through-hole of the circuit board.

There has been disclosed a technology in which in order to facilitate insertion of a press-fit terminal into a through-hole of a circuit board even when the distance from the housing of a connector to the through-hole of the circuit board becomes large, a terminal-alignment member is provided in the circuit board (for example, Patent Document 1). The terminal-alignment member has a penetration hole corresponding to the through-hole of the circuit board and is provided with a guide hole that opens more widely as the press-fit terminal penetrates it and approaches the outer surface. This guide hole facilitates adjustment of the position of the press-fit terminal of the connector and insertion of the press-fit terminal into the through-hole.

CITATION LIST

Patent Literature

Patent Document 1: Japanese Patent Application Laid-Open No. 2005-302614

SUMMARY OF INVENTION

Technical Problem

In the technology disclosed in Patent Document 1, it is required to additionally dispose the terminal-alignment member in the circuit board. Accordingly, the number of components in the circuit connection apparatus increases and hence the product cost rises. Moreover, because there is required a process where the terminal-alignment member is assembled to the circuit board, the number of man-hours increases, the manufacturing cost rises, and the production cost further rises. Moreover, in the case where the relative position between the connector and the circuit board largely deviates from a reference dimension, the front end of the press-fit terminal may collide with the guide hole or the periphery of the guide hole of the terminal-alignment member at an obtuse angle and hence the quality may be adversely affected, for example, the terminal is buckled.

A circuit connection apparatus according to the present disclosure is an apparatus for solving the foregoing problems in the conventional apparatuses. With regard to a circuit connection apparatus for connecting a press-fit terminal with a through-hole of a circuit board spaced a predetermined distance apart from the housing of a connector provided with the press-fit terminal, the objective of the present disclosure is to obtain a circuit connection apparatus in which the respective positions of the press-fit terminal and the through-hole of the circuit board are accurately determined so as to raise the reliability and in which the production cost is suppressed from rising through a simple assembly process that does not require any terminal-alignment member. Moreover, the objective of the present disclosure is to obtain an electric rotating machine apparatus provided with such a circuit connection apparatus as described above. Furthermore, the objective of the present disclosure is to obtain a circuit-connection-apparatus manufacturing method in which the respective positions of the press-fit terminal and the through-hole of the circuit board are accurately determined so as to raise the reliability and in which the production cost is suppressed from rising through a simple assembly process that does not require any terminal-alignment member.

Solution to Problem

A circuit connection apparatus according to the present disclosure has a connector including a housing in which a connection terminal is contained in a container having an opening portion, a positioning guide portion provided therein at a side opposite to that of the opening portion of the housing, and a press-fit terminal extended from the connection terminal, a heat sink that has a guide receipt portion fitted with the positioning guide portion and an opening to be penetrated by the press-fit terminal and to which the housing is fixed, and a circuit board that has a board positioning guide portion and a through-hole to which the press-fit terminal is pressure-bonded and that is fixed to a surface of the heat sink, opposite to the surface to which the housing is fixed.

An electric rotating machine apparatus according to the present disclosure is provided with the foregoing circuit connection apparatus.

A manufacturing method for a circuit connection apparatus according to the present disclosure includes a first step in which a circuit board having a through-hole into which a press-fit terminal is inserted and a board positioning penetration hole is fixed to a front side surface of a heat sink having a penetration hole that is concentric with the board positioning penetration hole and whose inner diameter is smaller than that of the board positioning penetration hole and an opening to be penetrated by the press-fit terminal, and a second step in which a connector having a housing in which a connection terminal is contained in a container having an opening portion, a positioning protruding portion extended from the housing to a side opposite to that of the opening portion, and the press-fit terminal extended in parallel with the positioning protruding portion from the connection terminal is fixed to a rear side surface of the heat sink in such a way that the positioning protruding portion is fitted with the penetration hole and that the press-fit terminal is pressure-bonded to the through-hole.

Advantageous Effects of Invention

The circuit connection apparatus according to the present disclosure makes it possible that the respective positions of the press-fit terminal and the through-hole of the circuit board are accurately determined so as to raise the reliability and that the production cost is suppressed from rising, through a simple assembly process that does not require any terminal-alignment member.

Moreover, the electric rotating machine apparatus according to the present disclosure can be provided with a circuit connection apparatus in which the respective positions of the press-fit terminal and the through-hole of the circuit board are accurately determined so as to raise the reliability and in which the production cost is suppressed from rising, through a simple assembly process that does not require any terminal-alignment member. Accordingly, the reliability of the electric rotating machine apparatus can be raised and the cost thereof can be suppressed.

Furthermore, the manufacturing method for a circuit connection apparatus according to the present disclosure makes it possible that without requiring any terminal-alignment member, the respective positions of the press-fit terminal and the through-hole of the circuit board are accurately determined so as to raise the reliability and that manufacturing is performed while the cost is suppressed from rising, through a simple assembly process.

DESCRIPTION OF EMBODIMENTS

1. Embodiment 1

<Electric Rotating Machine Apparatus>

Figure 1:
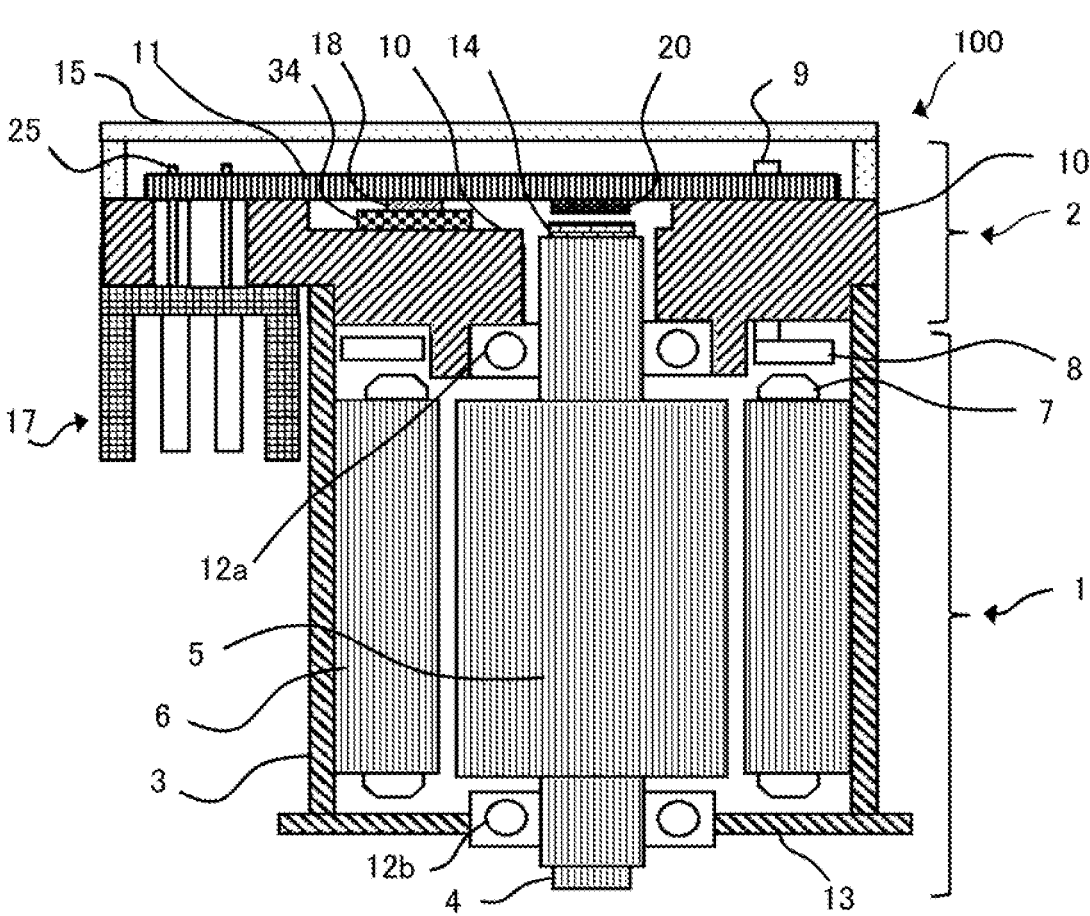
FIG. 1 is a cross-sectional view of an electric rotating machine apparatus according to Embodiment 1.

Hereinafter, a circuit connection apparatus 2 and an electric rotating machine apparatus 100 according to Embodiment 1 will be explained with reference to the drawings. FIG. 1 is a cross-sectional view representing the configuration of the electric rotating machine apparatus 100. FIG. 1 represents a cross section of the electric rotating machine apparatus 100, taken along a rotation axle 4 of a rotor 5 of an electric rotating machine 1 provided in the electric rotating machine apparatus 100.

The electric rotating machine apparatus 100 has the multiphase-winding electric rotating machine 1 and the circuit connection apparatus 2. The circuit connection apparatus 2 is an apparatus in which a terminal is extended out from the housing of an external connection connector 17 and is connected with a through-hole of a circuit board 11 on which electronic components are mounted, in such a way as to be spaced a predetermined distance apart from the hous- ing. The circuit connection apparatus 2 here is a control unit for controlling a current that flows in an armature winding 7 of a stator 6 of the electric rotating machine 1. The circuit connection apparatus 2 has a heat sink 10 between the connector 17 and the circuit board 11.

<Electric Rotating Machine>

The configuration of the electric rotating machine 1 will be explained. The electric rotating machine 1 includes the rotation axle 4 contained in a cylindrical tubular case 3, the rotor 5 fixed to the rotation axle 4, and the stator 6 having an inner circumferential surface that face the outer circum- ferential surface of the rotor 5 via an air gap. The armature winding 7 is wound around the stator 6; the stator 6 is press-fitted into and fixed to the inner surface of the case 3. In FIG. 1, the output side and the non-output side of the rotation axle 4 are drawn at the lower side and at the upper side, respectively.

A ring-shaped wiring portion 8 is disposed at the non- output side with respect to the armature winding 7. The ring-shaped wiring portion 8 is connected with the end portion of the armature winding 7 through TIG welding or the like. A wiring connection terminal 9 extends from the ring-shaped wiring portion 8 to the non-output side of the rotation axle 4 of the electric rotating machine in such a way as to penetrate the heat sink 10. The wiring connection terminal 9 is electrically connected with a winding end portion of the armature winding 7 through the intermediary of the ring-shaped wiring portion 8.

The wiring connection terminal 9 includes three electric conductors connected with respective wiring connection terminals of a U-phase winding, a V-phase winding, and a W-phase winding of the armature winding 7. The wiring connection terminal 9 of each of the phases is extended into the circuit connection apparatus 2 and the is connected with the circuit board 11 through soldering or the like.

Two or more pairs of permanent magnets (unillustrated) forming magnetic-field poles are arranged in the circumfer- ential surface of the rotor 5. A first bearing 12*a* and a second bearing 12*b* for pivotally supporting the rotation axle 4 are arranged at the non-output side and at the output side, respectively, of the non-output side with respect to the rotor 5. The first bearing 12*a* is disposed at a rotation-axis portion of the heat sink 10. The heat sink 10 works as a cover for sealing the inside of the electric rotating machine apparatus 100. In contrast, the second bearing 12*b* is fixed to a structural member 13 at the output side of the electric rotating machine apparatus 100. In addition, a sensor rotor 14 is fixed to the anti-output-side end portion of the rotation axle 4. The sensor rotor 14 has a pair of or two or more pairs of permanent magnets.

<Circuit Connection Apparatus>

Figure 2:
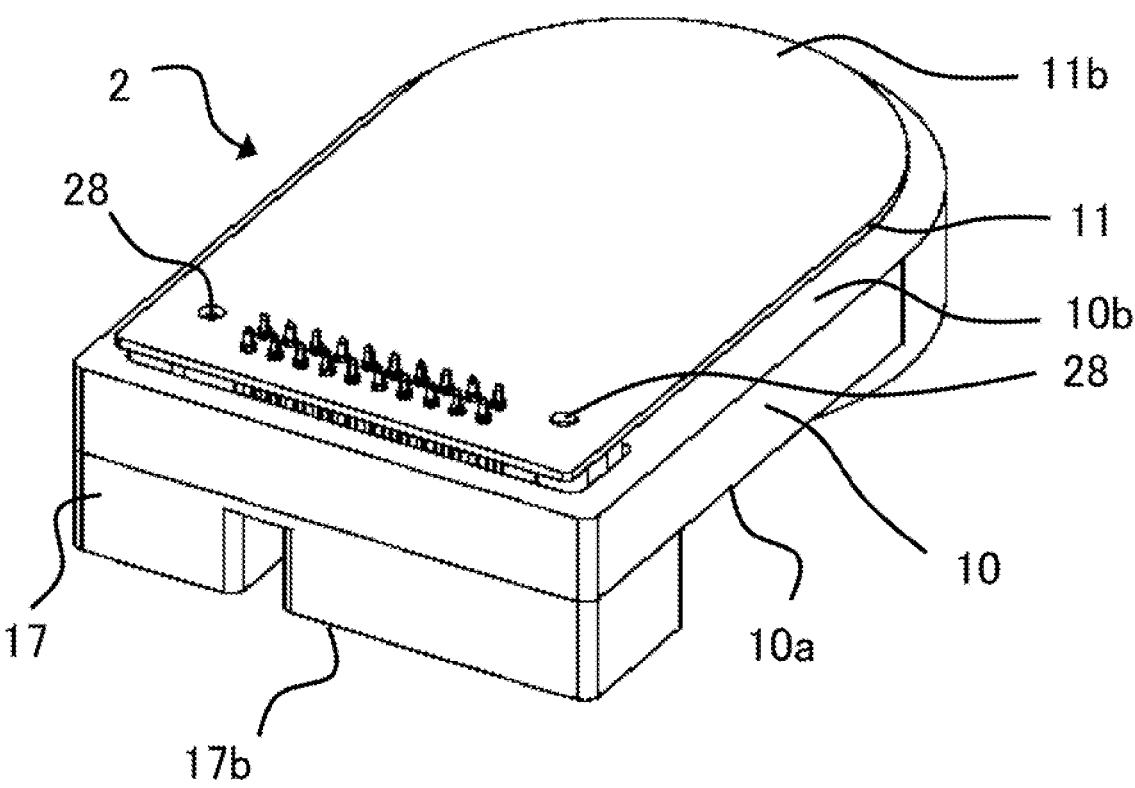
FIG. 2 is a perspective view of a circuit connection apparatus according to Embodiment 1.

Next, the configuration of the circuit connection apparatus 2 will be explained. FIG. 2 is a perspective view of the circuit connection apparatus 2 according to Embodiment 1. The outer layer of the circuit connection apparatus 2 is covered with a cover 15 (FIG. 2 shows a state of the circuit connection apparatus 2 at a time when the cover 15 is removed). The circuit connection apparatus 2 includes the heat sink 10 and the connector 17 and the circuit board 11 that are mounted to each corresponding one of the both surfaces of the heat sink 10. The connector 17 is mounted to a connecter mounting surface 10*a* of the heat sink 10. The circuit board 11 is mounted to a circuit-board mounting surface 10*b* of the heat sink 10. In addition, FIG. 2 shows an example in which a connector insertion/extraction side sur- face 17*b* of the connector 17 faces the output side; however, it is also made possible to configure the circuit connection apparatus 2 in such a way that the connector insertion/ extraction side surface 17*b* faces the anti-output side.

<Circuit Board>

Figure 3:
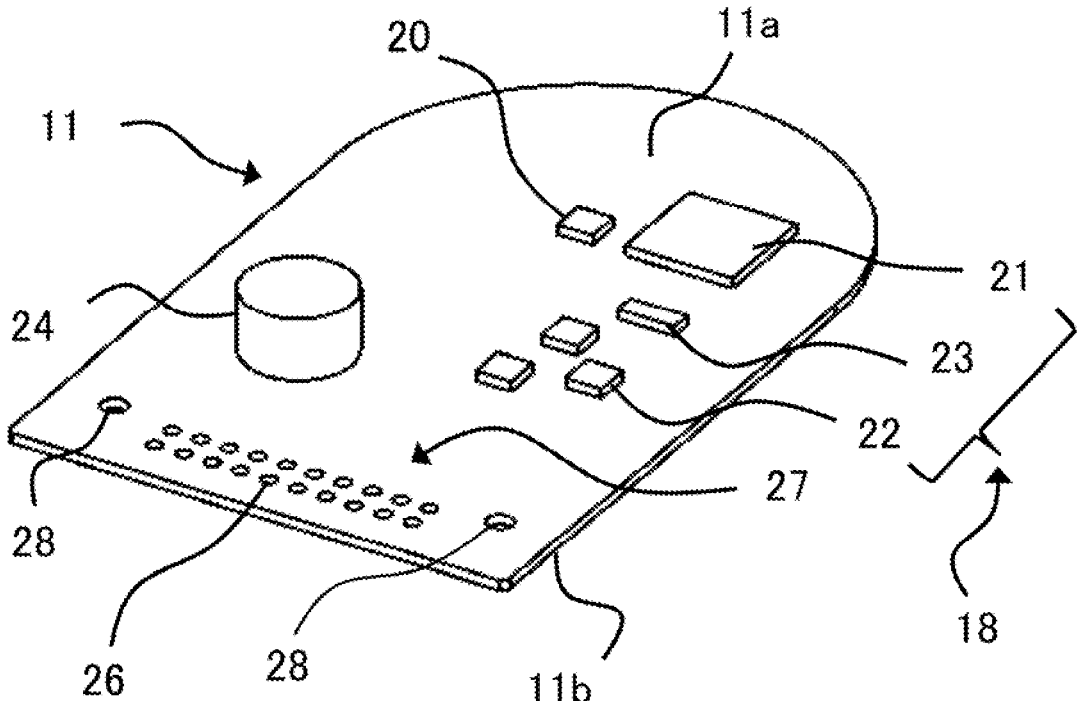
FIG. 3 is a perspective view of a circuit board of the circuit connection apparatus according to Embodiment 1.

FIG. 3 is a perspective view of the circuit board 11 of the circuit connection apparatus 2 according to Embodiment 1, when viewed from a board heat-sink mounting surface 11*a*. The circuit board 11 is referred to also as a printed wiring board. On the circuit board 11, a rotation sensor 20 is disposed coaxially with the sensor rotor 14 via a gap. The rotation sensor 20 detects a change in the magnetic field from the permanent magnet of the sensor rotor 14 that rotates as the rotation axle 4 rotates, and then converts the change in the magnetic field into an electric signal. In addition, the rotation sensor 20 has been explained as a magnetic sensor; however, it may be allowed that a resolver, a Hall sensor, an optical sensor, or the like is utilized.

In addition to the rotation sensor 20, heat-generating electronic components such as a microcontroller 21, a switching device 22, and a shunt resistor 23 are mounted on the circuit board 11. These electronic components will collectively be referred to as heat-generating components 18. Moreover, large-size electronic components such as a smoothing capacitor 24 and the like are mounted on the circuit board 11. Furthermore, the circuit board 11 is pro- vided with a terminal connection portion 27 where respec- tive through-holes 26 into which press-fit terminals 25 of the connector 17 are inserted. Still moreover, in the circuit board 11, board positioning penetration holes 28 are provided in such a way as to sandwich the terminal connection portion 27.

<Connector>

Figure 4:
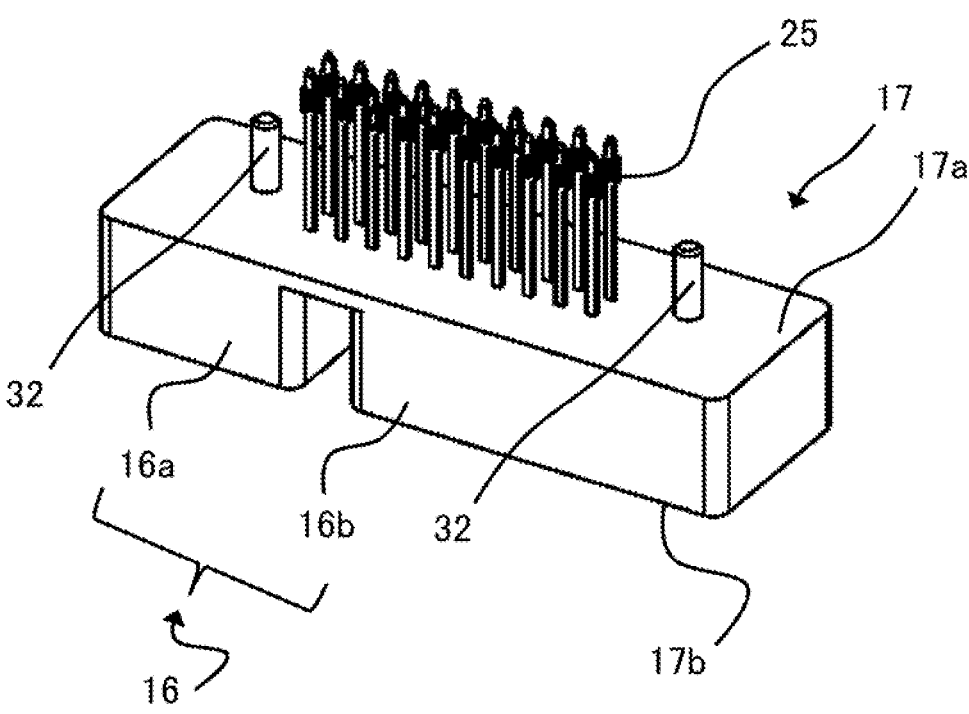
FIG. 4 is a perspective view of a connector of the circuit connection apparatus according to Embodiment 1, when viewed from a heat sink mounting surface.
Figure 5:
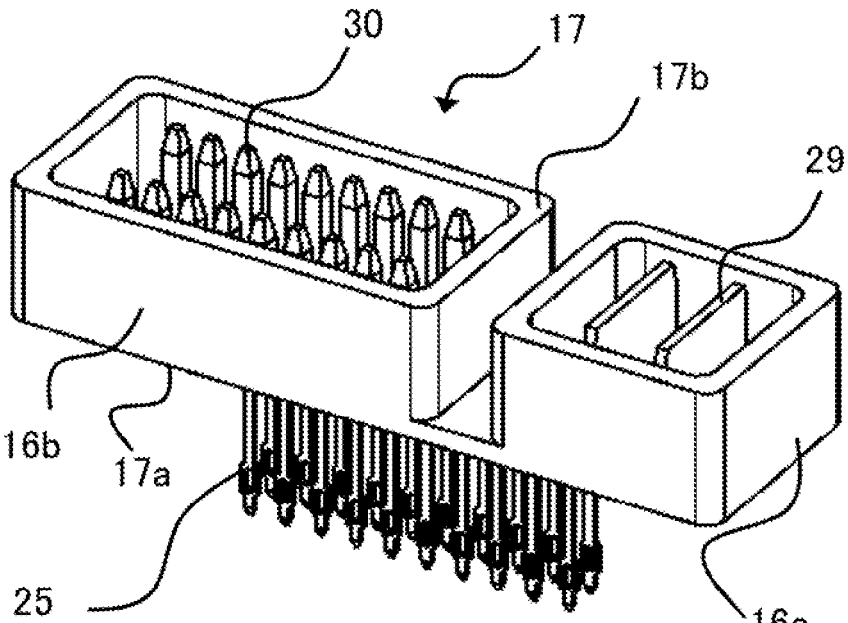
FIG. 5 is a perspective view of the connector of the circuit connection apparatus according to Embodiment 1, when viewed from a connector insertion/extraction side.

FIG. 4 is a perspective view of the connector 17 of the circuit connection apparatus 2 according to Embodiment 1, when viewed from a side facing a heat-sink mounting surface 17*a*. FIG. 5 is a perspective view of the connector 17 of the circuit connection apparatus 2 according to Embodi- ment 1, when viewed from a connector insertion/extraction side surface 17*b*. The connector 17 has a power-source side housing 16*a* for containing power-source terminals 29 to be connected with an external power source (battery) and a signal side housing 16*b* for containing signal terminals 30 to be connected with respective sensors. The power-source side housing 16*a* and the signal side housing 16*b* will collec- tively be referred to as a housing 16. The housing 16 is in the shape of a container having an opening portion and contains connection terminals. In the present embodiment, there has been described an example where the housing 16 has two separate parts; however, the overall housing 16 may be in the shape of a single container. In addition, the housing 16 may be in the shape of three or more separate containers. The respective connection terminals may each have the same shape; alternatively, the connection terminals may be sepa- rated into three or more groups that each have different shapes.

The press-fit terminals 25 are the respective front ends that extend from the power-source terminal 29 and the signal terminal 30 and that are to be connected with the circuit board 11. In the present embodiment, there has been described an example where the press-fit terminals 25 extend to the side opposite to the side of the power-source terminal 29 and the signal terminal 30 arranged at the opening portion side of the housing 16. However, it may be allowed that the press-fit terminals 25 are extended in a direction different from the direction to which the opening portion of the housing 16 are oriented, such as a direction perpendicular to the opening portion.

The press-fit terminal 25 extending from the heat-sink mounting surface 17*a* of the connector 17 is connected with the through-hole 26 of the circuit board 11. The press-fit terminal 25 is a terminal to be inserted into the through-hole 26 of the circuit board 11 so that electric connection can be performed. Utilizing the press-fit terminal 25 makes it possible to secure electric connection between the circuit board 11 and the terminal of the connector 17 without applying soldering. Accordingly, utilizing the press-fit terminal 25 makes it possible to facilitate manufacturing of the circuit connection apparatus 2 and hence shorten the manufacturing time. As a result, the cost of the circuit connection apparatus 2 can be reduced. The connector 17 is provided with cylindrical columnar positioning protruding portions 32 for positioning the connector 17 on the heat sink 10. The positioning protruding portion 32 extends in parallel with the press-fit terminal 25. In addition, the respective positioning protruding portions 32 are provided at the both sides of the press-fit terminal 25 in such a way as to sandwich the press-fit terminal 25. Accordingly, the positioning protruding portions 32 make it possible to accurately adjust the position of the press-fit terminal 25.

Here, there will be considered a state where the connector 17 is mounted on the heat sink 10 combined with the circuit board 11. In this situation, the length of the positioning protruding portion 32 is set in such a way that the length from the front end of the positioning protruding portion 32 to the connecter mounting surface 10*a* of the heat sink 10 is longer than the length from the front end of the press-fit terminal 25 to the board heat-sink mounting surface 11*a* of the circuit board 11.

Due to the foregoing setting, when the connector 17 is mounted to the heat sink 10 with which the circuit board 11 is assembled, the positioning protruding portion 32 of the connector 17 is inserted into a penetration hole 36 of the heat sink 10 and then insertion of the press-fit terminal 25 into the through-hole 26 is started. Because before the press-fit terminal 25 is inserted into the through-hole 26 of the circuit board 11, the positioning protruding portion 32 of the connector 17 is inserted into the penetration hole 36 of the heat sink 10; therefore, accurate positioning is performed. As a result, it is made possible to smoothly insert the press-fit terminal 25 into the through-hole 26 of the circuit board 11. Because the positional relationship between the connector 17 and the circuit board 11 can accurately be set, there can be prevented a problem that the front end of the press-fit terminal 25 collides with the periphery of the through-hole 26 of the circuit board 11 and hence the press-fit terminal 25 is buckled, which adversely affects the quality.

<Heat Sink>

Figure 6:
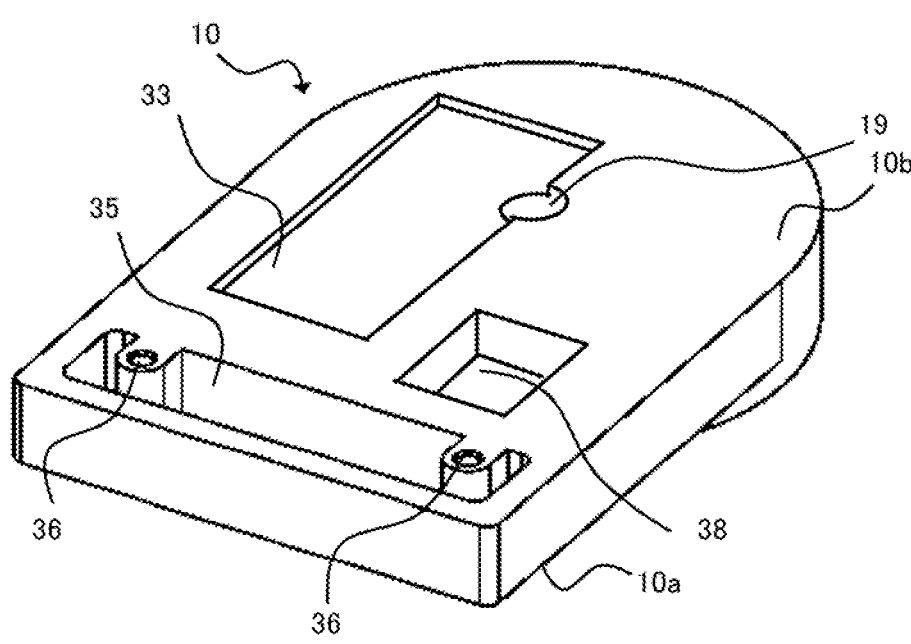
FIG. 6 is a perspective view of a heat sink of the circuit connection apparatus according to Embodiment 1.

FIG. 6 is a perspective view of the heat sink 10 of the circuit connection apparatus 2 according to Embodiment 1, when viewed from the circuit-board mounting surface 10*b*. A heat radiation portion 33 provided on the circuit-board mounting surface 10*b* of the heat sink 10 is painted with heat-radiation grease 34. This makes it possible that the heat-generating components 18, such as the switching device 22 and the shunt resistor 23 mounted on the circuit board 11, that need to radiate heat can radiate heat to the heat sink 10 through the intermediary of the heat-radiation grease 34.

A large component containing portion 38 for preventing interference with a large electronic component such as the smoothing capacitor 24 is provided in the circuit-board mounting surface 10*b* of the heat sink 10. A rotation-axle penetration hole 19 is a penetration hole for the rotation sensor 20 to detect the rotation state of the rotation axle 4 through the sensor rotor 14 mounted on the non-output side end of the rotation axle.

In FIG. 5, there has been shown an example where the electronic components that need to radiate heat are arranged on the output side surface, of the rotation axle, of the circuit board 11; however, it may be allowed that the electronic components are arranged on the anti-output-side surface, of the rotation axle, of the circuit board 11. Moreover, it may be allowed that the heat-radiation grease 34 is filled into the space between the circuit board 11 and the heat sink 10 in the area other than that where the heat-generating components 18 exist.

The heat sink 10 is provided with an opening 35 for preventing interference at a time when the press-fit terminal 25 of the connector 17 is inserted into the through-hole 26 of the circuit board 11. In addition, the heat sink 10 is provided also with the penetration hole 36 that fits with the positioning protruding portion 32 of the connector 17.

The board positioning penetration hole 28 of the circuit board 11, the positioning protruding portion 32 of the connector 17, and the penetration hole 36 of the heat sink 10 are arranged coaxially with one another. In addition, the diameter of the penetration hole 36 in the heat sink 10 is set to be smaller than the diameter of the board positioning penetration hole 28 in the circuit board 11 and to be slightly larger than the diameter of the positioning protruding portion 32 of the connector 17.

When the penetration hole 36 of the heat sink 10, the board positioning penetration hole 28 of the circuit board 11, and the positioning protruding portion 32 of the connector 17 are set in such a way as described above, the assembly efficiency of the circuit connection apparatus 2 is raised. After the heat sink 10 and the circuit board 11 are accurately assembled with each other by adjusting the relative position therebetween, the connector 17 can be mounted on the heat sink 10 by making the positioning protruding portion 32 of the connector 17 fit with the penetration hole 36 of the heat sink 10. Because the respective relative positions are accurately adjusted, it is made possible to readily and accurately press-fit the press-fit terminal 25 of the connector 17 into the through-hole 26 of the circuit board 11.

In the above description, there has been explained an example where in order to adjust the positional relationships among the connector 17, the heat sink 10, and the circuit board 11, the positioning protruding portion 32, the penetration hole 36, and the board positioning penetration hole 28 are provided. However, the positioning protruding portion 32 of the connector 17 can be replaced by a positioning concave portion 332, as long as the positioning concave portion 332 plays the role of a positioning guide portion. In that case, it may be allowed that in order to perform the function as a guide receipt portion of the heat sink 10, not the penetration hole 36 but a connector positioning protruding portion 336 is provided and is fitted with the positioning concave portion 332 of the connector 17 so that accurate position adjustment is performed. In addition, it may be allowed that in order to perform the function as a board positioning guide portion of the circuit board 11, the board positioning penetration hole 28 is utilized as it is, and a board positioning protruding portion 337 is provided in the heat sink 10 so that the board positioning penetration hole 28 and the board positioning protruding portion 337 fit with each other and hence the position adjustment can be performed (the positioning concave portion 332, the connector positioning protruding portion 336, and the board positioning protruding portion 337 are not illustrated).

In the case where even such a configuration is adopted, after the heat sink 10 and the circuit board 11 are accurately assembled with each other by adjusting the relative position therebetween through fitting between the board positioning protruding portion 337 and the board positioning penetration hole 28, the positioning concave portion 332 of the connector 17 is fitted with the connector positioning protruding portion 336 of the heat sink 10, the connector 17 can accurately be mounted. As a result, it is made possible to readily and accurately press-fit the press-fit terminal 25 of the connector 17 into the through-hole 26 of the circuit board 11.

<Board Assembling Tool>

Figure 7:
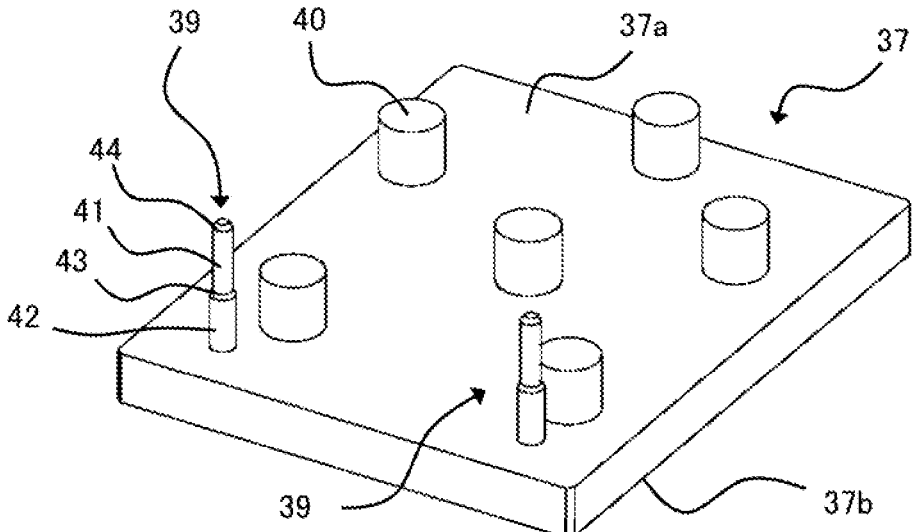
FIG. 7 is a perspective view of a board assembling tool for the circuit connection apparatus according to Embodiment 1.

Next, an assembly procedure of the circuit connection apparatus 2 will be explained. FIG. 7 is a perspective view of a board assembling tool 37 for the circuit connection apparatus 2 according to Embodiment 1. On a board assembling surface 37*a* of the board assembling tool 37, there are provided a tool positioning protruding portion 39 for determining the position of the board assembling tool 37 with respect to the heat sink 10 and a pressing protruding portion 40 that is formed of a flexible elastic material and presses the circuit board 11 so as to press and expand the heat-radiation grease 34 applied to the heat sink 10.

The tool positioning protruding portion 39 of the board assembling tool 37 has a first columnar portion 41, a second columnar portion 42, an intermediate tapered portion 43, and a front-end tapered portion 44. The diameter of the first columnar portion 41 is set to be smaller than the diameter of the second columnar portion 42 and slightly smaller than the diameter of the penetration hole 36 provided in the heat sink 10.

The diameter of the second columnar portion 42 is set to be slightly larger than the diameter of the board positioning penetration hole 28 provided in the circuit board 11. The angle of the intermediate tapered portion 43 is set within 1° to 60° from the respective cylinder portions of the first columnar portion 41 and the second columnar portion 42.

It is desirable that the pressing protruding portion 40 is disposed in the periphery of the heat-generating components 18 that need to radiate heat. This is because the heat-radiation grease 34 is to be pressed and expanded. Moreover, a floating mechanism (unillustrated) is provided between the board assembling tool 37 and facilities so that the board assembling tool 37 can freely move in the direction parallel to the board assembling surface 37*a*. Moreover, a tool (unillustrated) other than the foregoing board assembling tool 37 is provided beneath the heat sink 10 so as to fix the heat sink 10.

<Assembly Procedure>

Figures 8, 9:
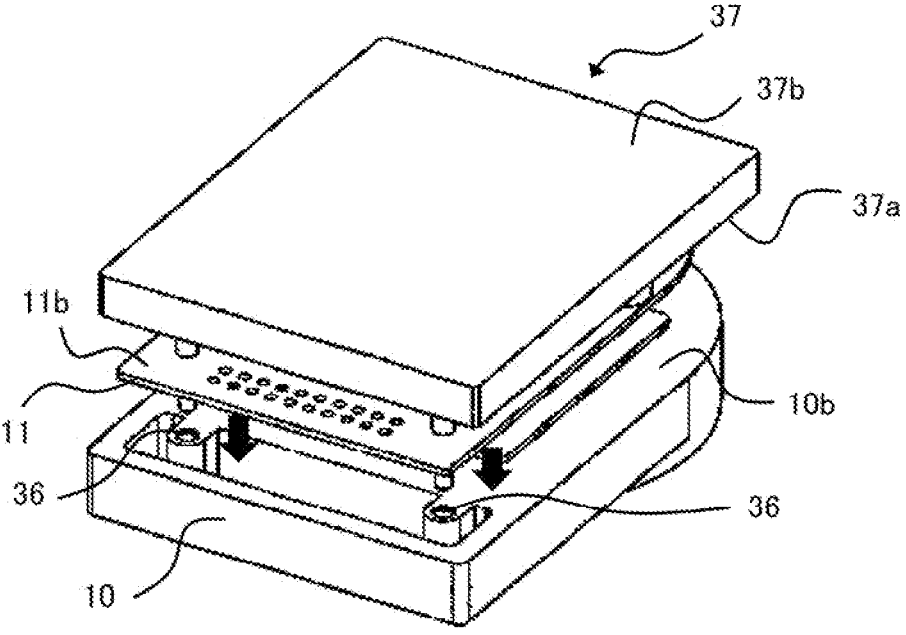
FIG. 8 is a first assembly drawing of the circuit connection apparatus according to Embodiment 1.
FIG. 9 is a second assembly drawing of the circuit connection apparatus according to Embodiment 1.

FIGS. 8 through 12 are first to fifth assembly drawings for the circuit connection apparatus 2 according to Embodiment 1. FIG. 8 is a first assembly drawing. In FIG. 8, the board assembling tool 37 is set upside down so that the board assembling surface 37*a* is at the down side. The circuit board 11 is mounted to the board assembling tool 37 from below in such a way that the board heat-sink non-mounting surface 11*b* is at the upside. FIG. 8 shows a state at a time before the first columnar portion 41 of the board assembling tool 37 is inserted into the board positioning penetration hole 28 of the circuit board 11.

FIG. 9 is a second assembly drawing. FIG. 9 shows a state where the circuit board 11, which has been set to the board assembling tool 37, is mounted to the circuit-board mounting surface 10*b* of the heat sink 10. The circuit-board mounting surface 10*b* of the heat sink 10 will be referred to as a front side surface. The first columnar portion 41 of the board assembling tool 37 is inserted into the penetration hole 36 of the heat sink 10. In this situation, a gap occurs between the first columnar portion 41 and the penetration hole 36.

Figure 10:
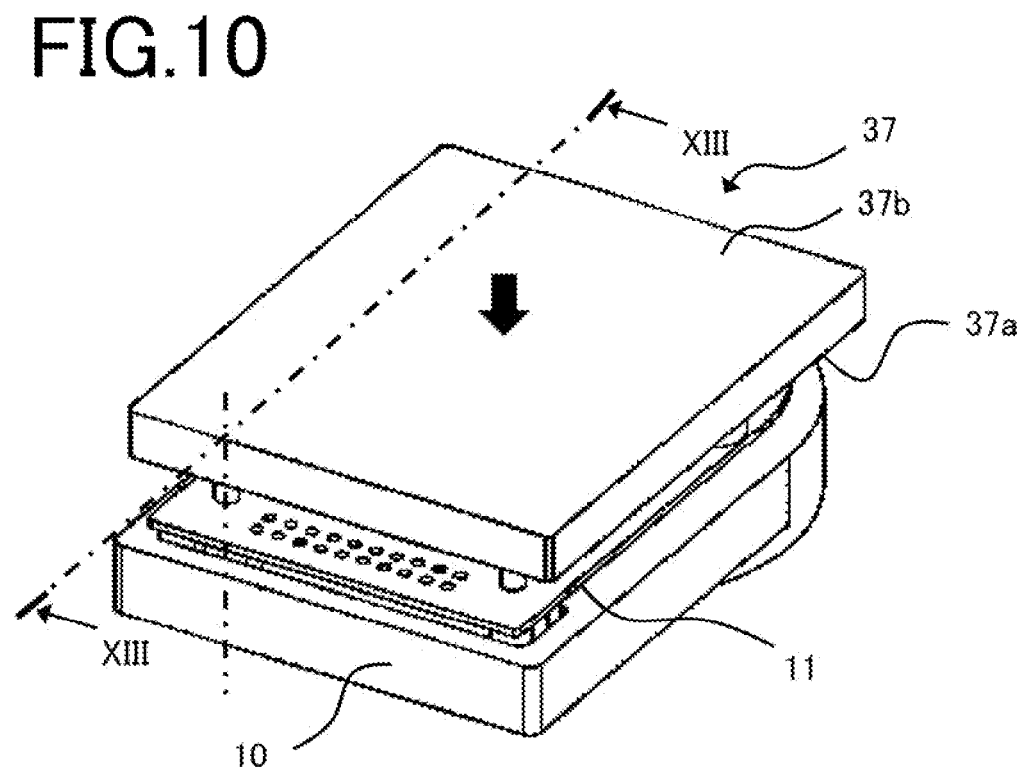
FIG. 10 is a third assembly drawing of the circuit connection apparatus according to Embodiment 1.
Figure 13:
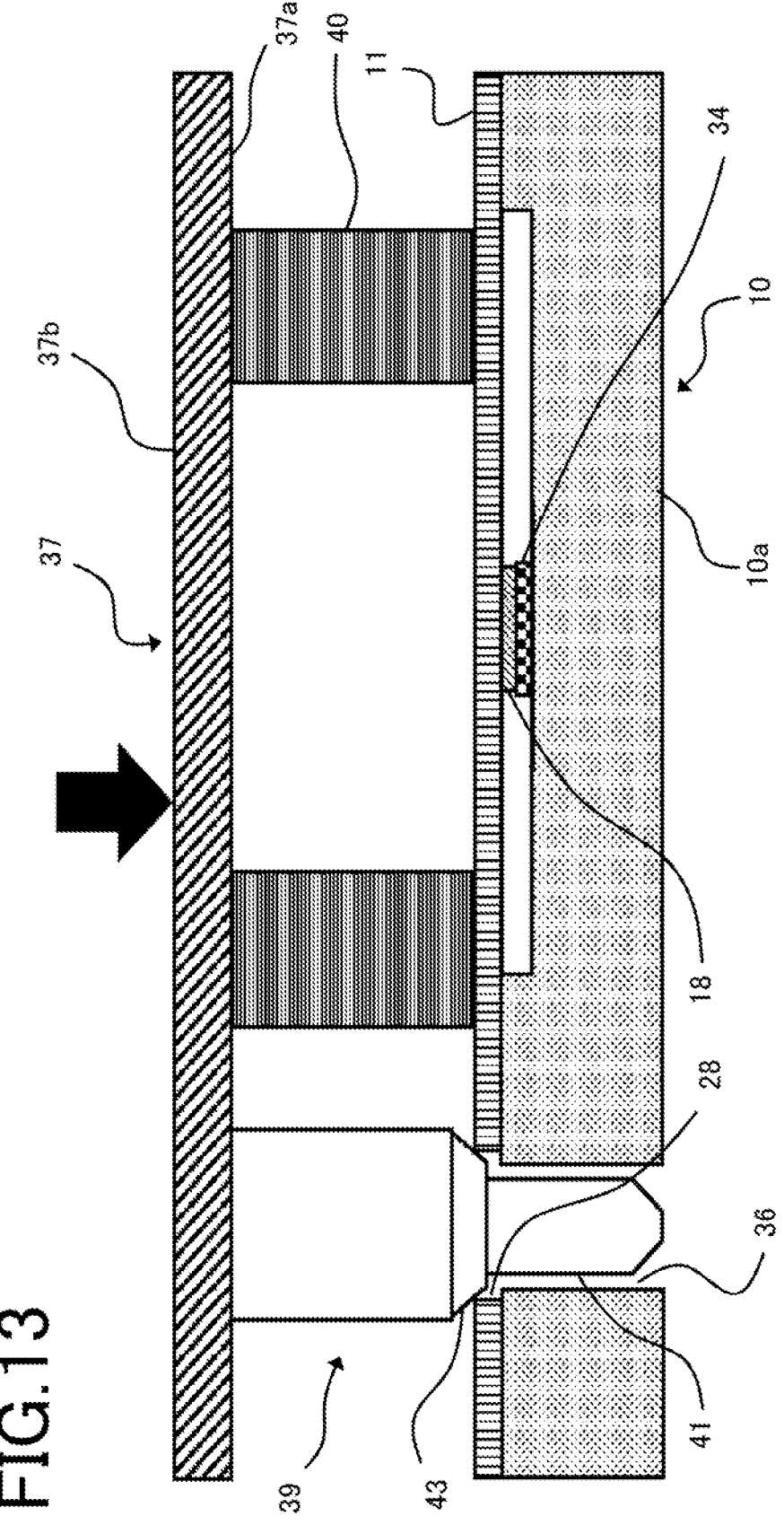
FIG. 13 is a circuit-board-assembled cross-sectional view of the circuit connection apparatus according to Embodiment 1.

FIG. 10 is a third assembly drawing. In FIG. 10, a load is applied to a board non-assembly surface 37*b*, which is the rear side of the board assembling surface 37*a* of the board assembling tool 37, in a direction perpendicular thereto (in the direction indicated by the arrow in FIG. 10). The circuit board 11 and the heat sink 10 are fixed to each other through screwing, while the circuit board 11 is pressed against the heat sink 10. Although not illustrated in FIGS. 7 through 10, in order to fix the circuit board 11 to the heat sink 10 through screwing, under the condition that the respective positions of the circuit board 11 and the heat sink 10 are accurately adjusted, a penetration hole for screwing is provided in the board assembling tool 37. In addition, it may be allowed that for fixing the circuit board 11 to the heat sink 10, a fixation method other than screwing, such as fixation with an adhesive, fixation through welding, fixation through brazing, or fixation through soldering, is adopted. FIG. 13 illustrates a cross-sectional view of the circuit board 11 and the heat sink 10 that are screwed to each other, taken along the broken line indicated by XIII-XIII in FIG. 10.

Figure 11:
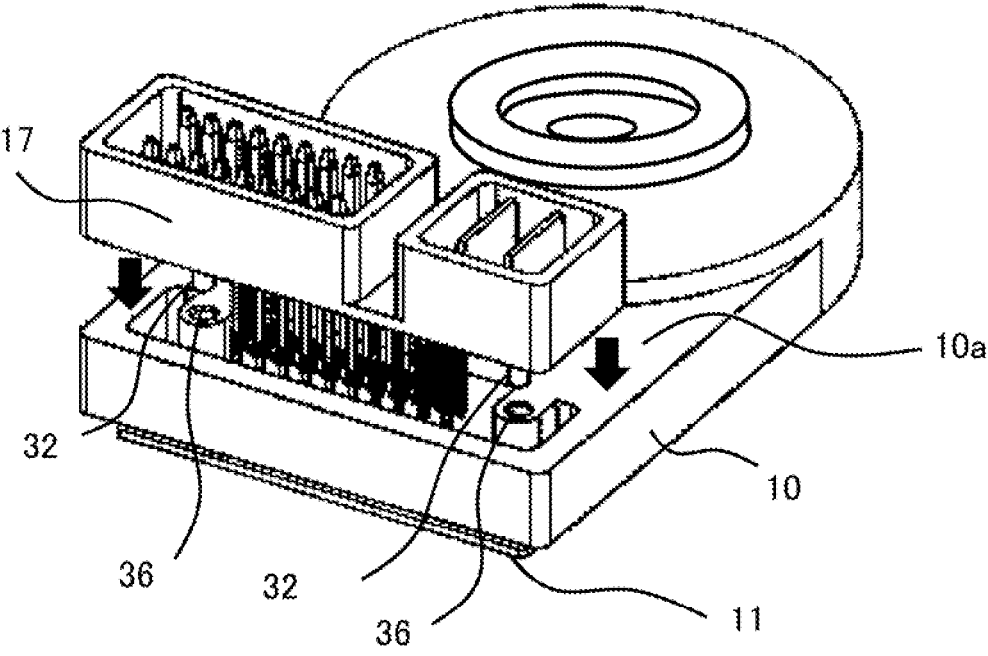
FIG. 11 is a fourth assembly drawing of the circuit connection apparatus according to Embodiment 1.

FIG. 11 is a fourth assembly drawing. In FIG. 11, the circuit board 11 and the heat sink 10 that are screwed and fixed to each other are removed from the board assembling tool 37; the upside and the down side thereof are reversed; then, they are set in such a way that the connecter mounting surface 10*a* of the heat sink 10 is at the upside. The connecter mounting surface 10*a* of the heat sink 10 will be referred to as a rear side surface. The positioning protruding portion 32 of the connector 17 is inserted into the penetration hole 36 of the heat sink 10.

Figure 12:
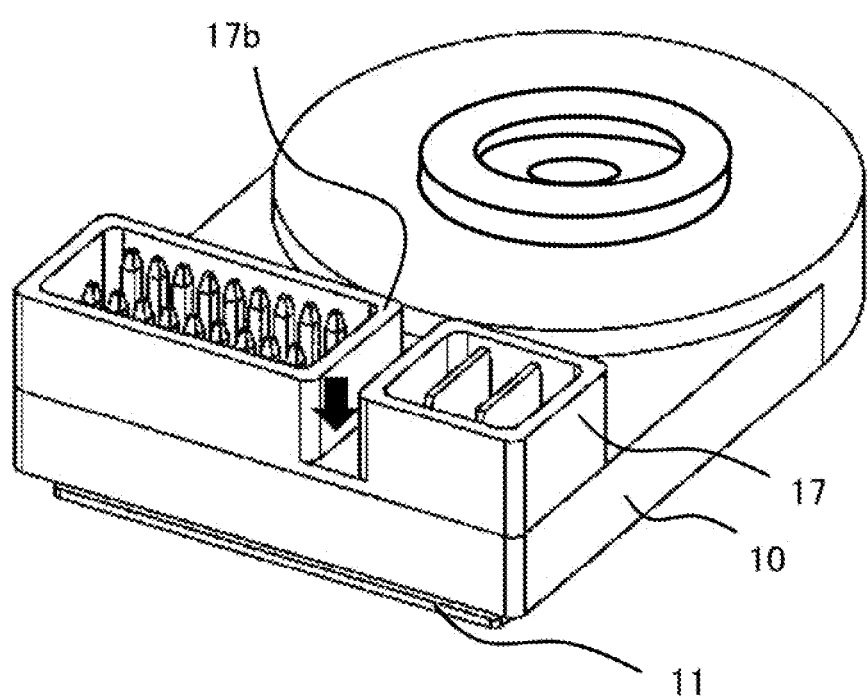
FIG. 12 is a fifth assembly drawing of the circuit connection apparatus according to Embodiment 1.

FIG. 12 is a fifth assembly drawing. In FIG. 12, the connector 17 is pressed into the heat sink 10 and then a load is applied to the connector insertion/extraction side surface 17*b*, which is the rear side of the heat-sink mounting surface 17*a* of the connector 17, in the vertical direction (in the direction indicated by the arrow in FIG. 12). The press-fit terminal 25 is press-fitted into and fixed to the through-hole 26.

In this situation, it may be allowed that as may be necessary, pressure is applied to the front end of the press-fit terminal 25 so that the press-fit terminal 25 is pressed in the axial direction thereof. This is because as the press-fit terminal 25, there exists such a kind of product whose diameter is enlarged by the axial-direction pressure and that is pressure-bonded to the through-hole 26. In the case of a product that holds electric contact only by being inserted into the through-hole 26, there can be omitted the process in which pressure is applied to the front end of the press-fit terminal 25 so that the press-fit terminal 25 is pressed in the axial direction thereof.

FIG. 13 is a circuit-board-assembled cross-sectional view of the circuit connection apparatus 2 according to Embodiment 1. FIG. 13 is a cross-sectional view obtained by cutting the board assembling tool 37, the circuit board 11, and the heat sink 10 illustrated in FIG. 10, along the broken line indicated by XIII-XIII. The board assembling tool 37 applies a load to the circuit board 11 (indicated by the arrow in FIG. 13). The intermediate tapered portion 43 of the tool positioning protruding portion 39 is pressed against the peripheral portion of the board positioning penetration hole 28 of the circuit board 11. Then, the position of the circuit board 11 moves in the horizontal direction and is adjusted so that the respective centers of the board positioning penetration hole 28 and the intermediate tapered portion 43 of the tool positioning protruding portion 39 coincide with each other. In this situation, the pressing protruding portion 40 presses and expands the heat-radiation grease 34 applied to the heat sink 10.

The first columnar portion 41 of the tool positioning protruding portion 39 having the front-end tapered portion 44 is inserted into the penetration hole 36 of the heat sink 10, so that the horizontal position of the heat sink 10 with respect to the tool positioning protruding portion 39 is adjusted. Then, the intermediate tapered portion 43 of the board assembling tool 37 is inserted into the board positioning penetration hole 28 of the circuit board 11, so that the horizontal position of the circuit board 11 with respect to the tool positioning protruding portion 39 is accurately adjusted.

As a result, the respective horizontal positions of the heat sink 10 and the circuit board 11 are accurately adjusted. Accordingly, in the case where in a post-process, the connector 17 is mounted to the heat sink 10, the respective positions of the press-fit terminal 25 of the connector 17 and the through-hole 26 of the circuit board 11 accurately coincide with each other; thus, the press-fit terminal 25 can smoothly be inserted into the through-hole 26.

In a connector assembling process, the positioning protruding portion 32 of the connector 17 is inserted into the penetration hole 36 of the heat sink 10. As a result, the respective positions of the connector 17 and the heat sink 10 are adjusted. Under the foregoing condition, the connector 17 is made to move in the direction in which the heat-sink mounting surface 17a of the connector 17 and the connecter mounting surface 10a of the heat sink 10 make contact with each other; then, the press-fit terminal 25 is inserted into the through-hole 26.

<Effects>

There will be explained effects that can be obtained by means of an apparatus configured in a foregoing manner. When in the electric rotating machine apparatus 100, the connector 17 is assembled while the respective center positions of the press-fit terminal 25 and the through-hole 26 do not coincide with each other, terminal buckling may cause an insertion defect and damage to the through-hole 26. In that case, the electrical insulation property of the circuit board 11 is deteriorated and hence a short circuit may occur between the wiring strip conductors or between the terminals.

In the circuit connection apparatus 2 according to Embodiment 1, in order to prevent interference between the press-fit terminal 25 and the heat sink 10, the opening 35 is provided in the heat sink 10, so that it is made possible to accurately arrange the circuit board 11 and the connector 17 through the intermediary of the heat sink 10. The board positioning penetration hole 28 of the circuit board 11, the positioning protruding portion 32 of the connector 17, and the penetration hole 36 of the heat sink 10 are arranged coaxially with one another. Accordingly, the respective positions of the circuit board 11 and the connector 17 are determined by use of the penetration hole 36 provided in the heat sink 10, so that positional variations at a time of assembly can be reduced and hence the respective centers of the press-fit terminal 25 and the through-hole 26 can accurately be determined.

In addition, the respective positioning protruding portions 32 are provided at the both sides of the press-fit terminal 25 in such a way as to sandwich the press-fit terminal 25. Accordingly, it is made possible that the respective positions of the centers of the press-fit terminal 25 and the through-hole 26 are accurately adjusted by the positioning protruding portion 32.

The heat-generating components 18 such as the inverter for controlling the electric rotating machine 1, the switching device utilized in the power-source circuit or the like, the shunt resistor, the microcontroller, and the IC are mounted on the circuit board 11 in the circuit connection apparatus 2 of the electric rotating machine apparatus 100. Accordingly, in many cases, the circuit board 11 is adhered to the heat sink 10 so as to be cooled and the external connection connector 17 is connected with the circuit board 11 in such a way that the heat sink 10 is sandwiched between the circuit board 11 and the external connection connector 17. In this situation, by use of the heat sink 10 situated between the housing 16 of the connector 17 and the circuit board 11, the respective positions of the connector 17 and the circuit board 11 are accurately adjusted, so that the circuit connection apparatus 2 can be provided through a simple assembly process that does not require any terminal-alignment member. These advantages can be applied not only to the electric rotating machine apparatus 100 but also to the circuit connection apparatus 2 in each of many application fields such as an inverter apparatus, a DC-DC converter apparatus, and a microcontroller-applied control apparatus that each utilize the circuit connection apparatus 2 utilizing a heat sink.

The diameter of the board positioning penetration hole 28 of the circuit board 11 is set to be larger than that of the penetration hole 36 of the heat sink 10. Accordingly, by applying a load to the board assembling tool 37 so that the intermediate tapered portion 43 of the tool positioning protruding portion 39 is pressed against the peripheral portion of the board positioning penetration hole 28 in the circuit board 11, the horizontal position of the circuit board 11 can be adjusted so that the respective centers of the board positioning penetration hole 28 and the tool positioning protruding portion 39 coincide with each other. As a result, the circuit board 11 can accurately be assembled to the heat sink 10.

Moreover, the length of the positioning protruding portion 32 of the connector 17 is set in such a way that the length from the front end of the positioning protruding portion 32 to the connecter mounting surface 10a of the heat sink 10 is longer than the length from the front end of the press-fit terminal 25 to the board heat-sink mounting surface 11a of the circuit board 11. This makes it possible that the press-fit terminal 25 is inserted into the through-hole 26 after the positioning protruding portion 32 of the connector 17 is inserted into the penetration hole 36 of the heat sink 10 so that the position of the connector 17 is restricted. As a result, the press-fit terminal 25 can securely be inserted into the through-hole 26.

Moreover, because when a load is applied to the board assembling tool 37, the pressing protruding portion 40 can press and expand the heat-radiation grease 34, the assembly process can be simplified and hence the product cost can be reduced. Furthermore, because accurate positioning can be performed with a space-saving and simple structure, without increasing the number of the components, the production costs can be suppressed.

As described above, in the circuit connection apparatus 2 having the connector 17 provided with the press-fit terminal 25, the press-fit terminal 25 is accurately positioned with respect to the through-hole 26, so that the reliability is raised and the production can be performed through a simple assembly process; therefore, the product cost can be suppressed. Moreover, it is made possible to provide a manufacturing method for the circuit connection apparatus 2, in which the press-fit terminal 25 is accurately positioned with respect to the through-hole 26 so that the reliability is raised and in which the product cost is suppressed through a simple assembly process.

The electric rotating machine apparatus 100 provided with the foregoing circuit connection apparatus 2 makes it possible to provide the electric rotating machine apparatus 100 whose reliability is similarly raised and that suppresses the product cost through a simple structure.

2. Embodiment 2

Embodiment 2 will be explained based on the drawings. The circuit connection apparatus 2 according to Embodiment 2 is a variant example of Embodiment 1; the objective thereof is to further raise the respective positioning accuracies for the press-fit terminal 25 and the through-hole 26. In the present embodiment, there will be explained a configuration in which the front-end tapered portion 44 of the board assembling tool 37 is pressed against a concave portion 48 of a guide tool 47 provided in such a way as to abut on the connecter mounting surface 10_a_ of the heat sink 10.

Figure 14:
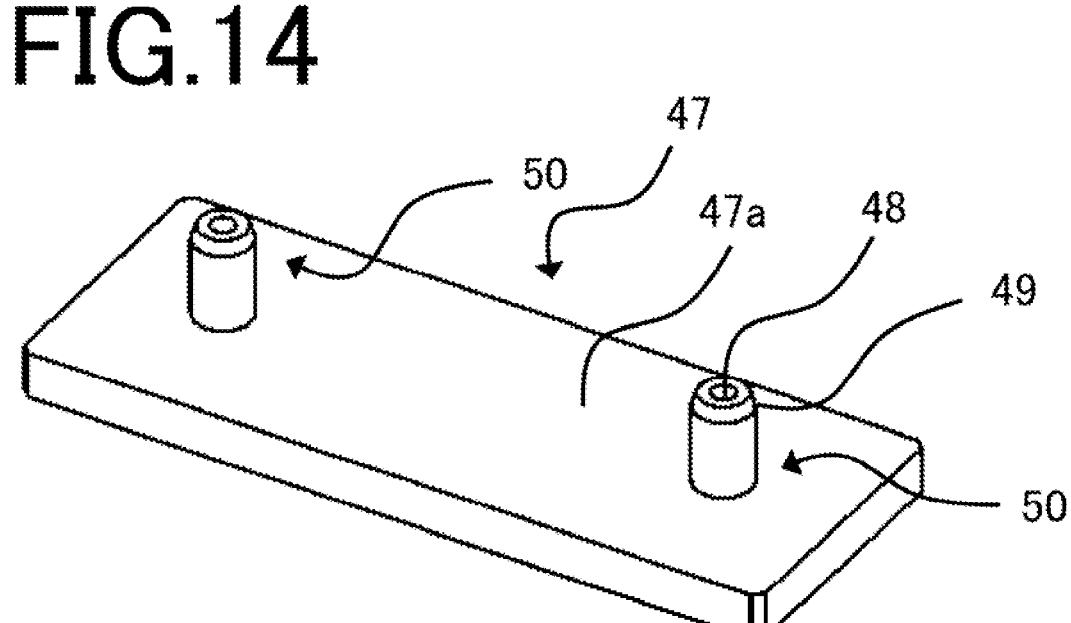
FIG. 14 is a perspective view of a guide tool for a circuit connection apparatus according to Embodiment 2.

FIG. 14 is a perspective view of the guide tool 47 for the circuit connection apparatus 2 according to Embodiment 2, when viewed from a heat-sink lower supporting surface 47_a_. The guide tool 47 has a cylindrical columnar guide protrusion 50 including a front-end tapered portion 49 and the concave portion 48 provided in the front-end surface thereof. The circuit connection apparatus 2 according to Embodiment 2 differs from the circuit connection apparatus 2 according to Embodiment 1 only in the shape of a penetration hole 136 of a heat sink 110 and addition of the guide tool 47. Accordingly, the reference numeral of the circuit connection apparatus 2 is the same as that of the circuit connection apparatus according to Embodiment 1.

Figure 15:
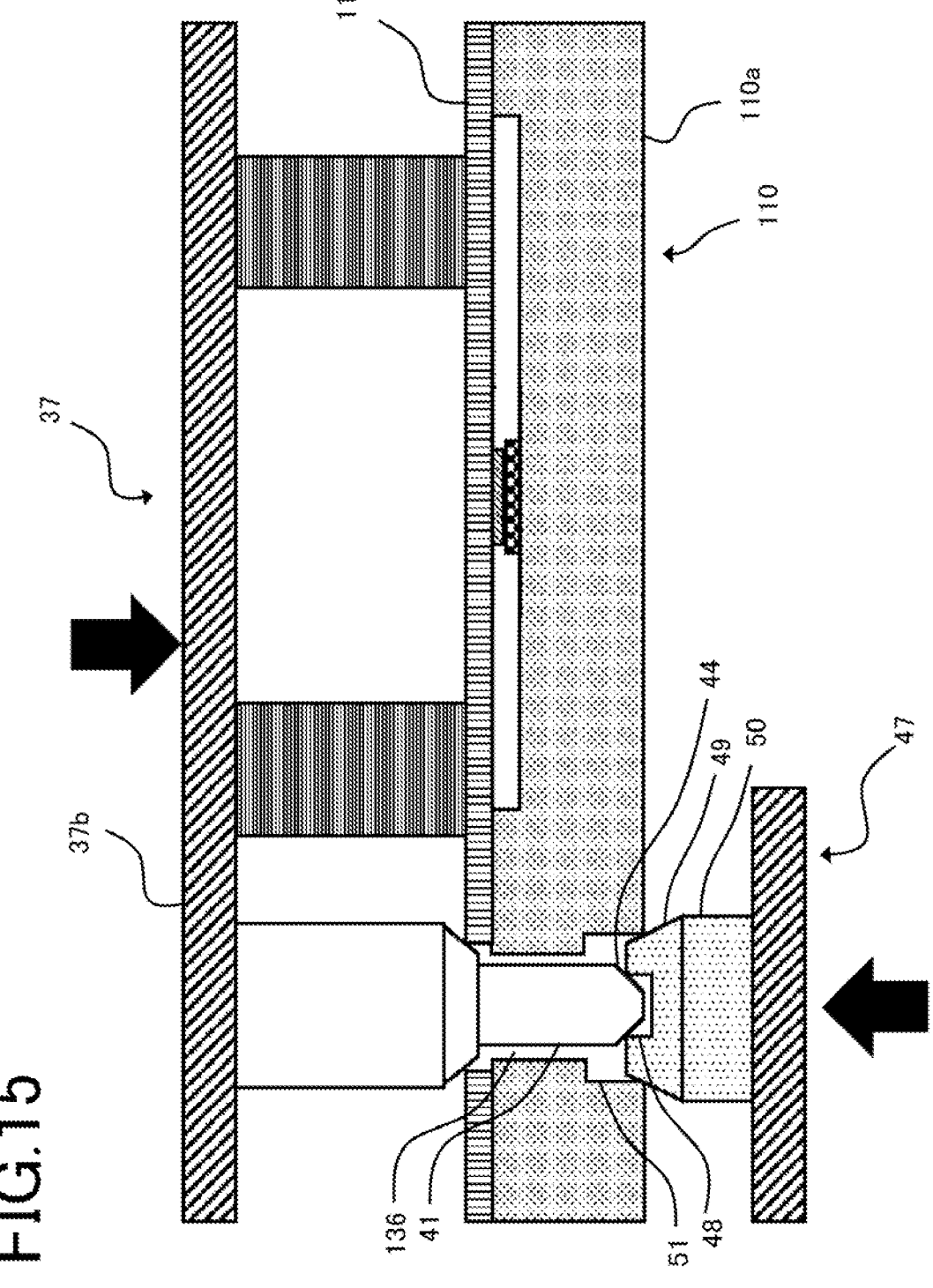
FIG. 15 is a circuit-board-assembled cross-sectional view of the circuit connection apparatus according to Embodiment 2.

FIG. 15 is a circuit-board-assembled cross-sectional view of the circuit connection apparatus 2 according to Embodiment 2. The guide tool 47 is assembled to a connecter mounting surface 110_a_ of the heat sink 110 from below.

In the penetration hole 136, at the connecter mounting surface 110_a_ side, provided in the heat sink 110, a stepped hole 51 whose diameter is larger than that of the penetration hole 136 is provided coaxially with the penetration hole 136. The respective shapes of the circuit board 11, the board assembling tool 37, and the connector 17 are the same as those in Embodiment 1.

Next, an assembling method for the circuit connection apparatus 2 will be explained. The front-end tapered portion 49 of the guide tool 47 is pressed against the peripheral portion of the stepped hole 51 provided in the heat sink 110. After that, while the circuit board 11 is assembled to the board assembling tool 37, the first columnar portion 41 of the tool positioning protruding portion 39 of the board assembling tool 37 is inserted into the penetration hole 136.

After the insertion of the first columnar portion 41, a load, which is larger than the load (indicated by the upward arrow in FIG. 15) for pressing the guide tool 47 against the heat sink 10, is applied in the vertical direction (indicated by the downward arrow in FIG. 15) to the board non-assembly surface 37_b_ of the board assembling tool 37. In this situation, the front-end tapered portion 44 of the board assembling tool 37 is pressed against the concave portion 48 of the guide tool

47. There will be explained effects that can be obtained by means of an apparatus configured in a foregoing manner.

In Embodiment 2, the stepped hole 51 whose diameter is larger than the diameter of the foregoing penetration hole 36 provided in the heat sink 10 is provided coaxially with the penetration hole 36. Because the front-end tapered portion 49 of the guide protrusion 50 of the guide tool 47 is pressed against the peripheral portion of the stepped hole 51 of the heat sink 110, the horizontal position of the heat sink 110 with respect to the guide tool 47 is accurately adjusted.

The guide protrusion 50 has a large diameter, and the concave portion 48 against which the front-end tapered portion 44 of the board assembling tool 37 is pressed is provided in the front end of the guide protrusion 50. The front-end tapered portion 44 of the board assembling tool 37 is pressed against the peripheral portion of the concave portion 48 in the front end of the guide protrusion 50 of the guide tool 47 by pressing the board assembling tool 37 downward, so that the respective positions of the board assembling tool 37 and the heat sink 110 are adjusted while the relative position between the board assembling tool 37 and the guide tool 47 is adjusted.

A load, which is larger than the load for pressing the guide tool 47 against the heat sink 10, is applied in the vertical direction to the board non-assembly surface 37_b_ of the board assembling tool 37, so that the respective positions of the circuit board 11 and the board assembling tool 37 can be adjusted after the respective positions of the board assembling tool 37 and the heat sink 10 are adjusted. Therefore, the respective positions of the circuit board 11 and the heat sink 10 can accurately be adjusted. That is to say, in addition to the effect in Embodiment 1, the heat sink 10 and the circuit board 11 can further accurately be positioned.

3. Embodiment 3

Embodiment 3 will be explained based on the drawings. The circuit connection apparatus 2 according to Embodiment 3 is a variant example of Embodiment 1; the objective thereof is not only to raise the respective positioning accuracies for the press-fit terminal 25 and the through-hole 26 but also to reduce the load on the circuit board 11 at a time of assembly. In the present embodiment, there will be explained a configuration in which a cylindrical tubular movable protrusion 53 of a board assembling tool 137 moves in the axial direction.

Figure 16:
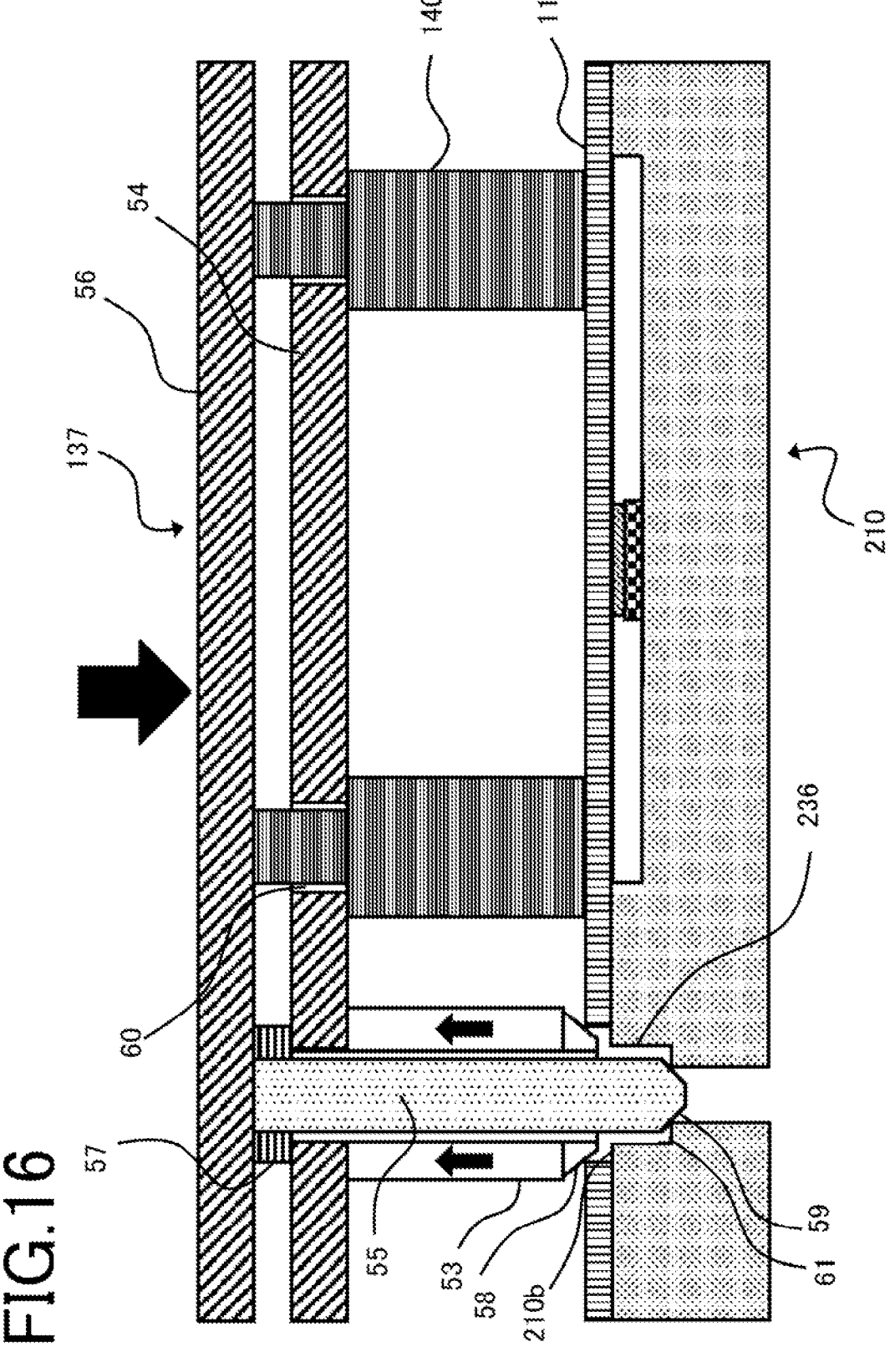
FIG. 16 is a circuit-board-assembled cross-sectional view of a circuit connection apparatus according to Embodiment 3.

FIG. 16 is a circuit-board-assembled cross-sectional view of the circuit connection apparatus 3 according to Embodiment 2. The board assembling tool 137 has a movable plate 54 to which the cylindrical tubular movable protrusion 53 is fixed, a base plate 56 provided with a fixed protrusion 55 penetrating the movable protrusion 53 and a pressing protruding portion 140, and a spring 57 into which the fixed protrusion 55 is inserted and that is disposed between the movable plate 54 and the base plate 56. The circuit connection apparatus 2 according to Embodiment 3 differs from the circuit connection apparatus 2 according to Embodiment 1 only in the shape of a penetration hole 236 of a heat sink 210 and the configuration of the board assembling tool 137. Accordingly, the reference numeral of the circuit connection apparatus 2 is the same as that of the circuit connection apparatus according to Embodiment 1.

A board pressing portion 58 is provided at the front end of the movable protrusion 53; a front-end tapered portion 59 is provided at the front end of the fixed protrusion 55. A releasing hole 60 that is penetrated by the pressing protruding portion 140 is provided in the movable plate 54. In addition, in the penetration hole 236, at a circuit-board mounting surface 210*b* side, of the heat sink 210, a stepped hole 61 whose diameter is larger than that of the foregoing penetration hole 236 is provided coaxially with the penetration hole 236. The respective shapes of the circuit board 11 and the connector 17 are the same as those in Embodiment 1.

In the circuit connection apparatus 2 according to Embodiment 3, when a load is applied to the board assembling tool 137, the board pressing portion 58 is pressed against the peripheral portion of the board positioning penetration hole 28 in the circuit board 11 and hence reactive force caused by the spring 57 presses the circuit board 11 against the heat sink 210. When the load is further applied, the front-end tapered portion 59 of the fixed protrusion 55 abuts on the peripheral portion of the stepped hole 61 in the heat sink 210. There will be explained effects that can be obtained by means of an apparatus configured in a foregoing manner.

In the circuit connection apparatus 2 according to Embodiment 3, in the penetration hole 236, at the circuit-board mounting surface 210*b* side, of the heat sink 210, the stepped hole 61 whose diameter is larger than that of the foregoing penetration hole 236 is provided coaxially with the penetration hole 236, so that the length of the board pressing portion 58 of the movable protrusion 53 can be set to be long. The front-end tapered portion 59 of the fixed protrusion 55 is pressed against the peripheral portion of the stepped hole 61 in the heat sink 210, so that the respective positions of the heat sink 210 and the board assembling tool 137 can accurately be adjusted. Moreover, board pressing portion 58 of the movable protrusion 53 is pressed against the peripheral portion of the board positioning penetration hole 28 in the circuit board 11, so that the respective positions of the circuit board 11 and the board assembling tool 137 can accurately be adjusted.

As a result of these actions, the respective positions of the circuit board 11 and the heat sink 210 can accurately be adjusted. Moreover, because when the board pressing portion 58 of the movable protrusion 53 is pressed against the peripheral portion of the board positioning penetration hole 28 in the circuit board 11, the movable protrusion 53 moves and hence elastic force caused by the spring 57 holds the circuit board 11, it is made possible that an excessive load on the circuit board 11 is suppressed and hence breakage of the circuit board 11 is prevented.

4. Embodiment 4

Embodiment 4 will be explained based on the drawings. The circuit connection apparatus 2 according to Embodiment 4 is a variant example of each of Embodiments 1 through 3; the objective thereof is to further raise the respective positioning accuracies for the press-fit terminal 25 and the through-hole 26. The circuit connection apparatus 2 according to Embodiment 4 is characterized in that ribs for press-fitting and fixing are provided in the protruding portion of the connector 17.

Figure 17:
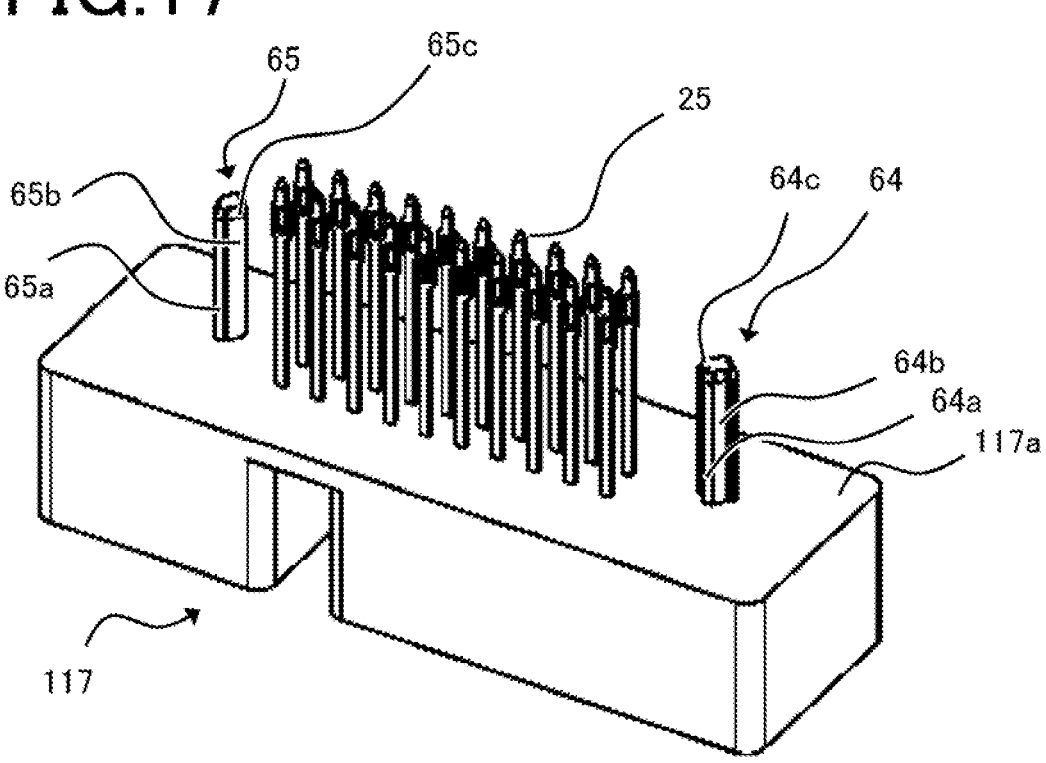
FIG. 17 is a perspective view of a connector of a circuit connection apparatus according to Embodiment 4, when viewed from a heat sink mounting surface.
Figure 18:
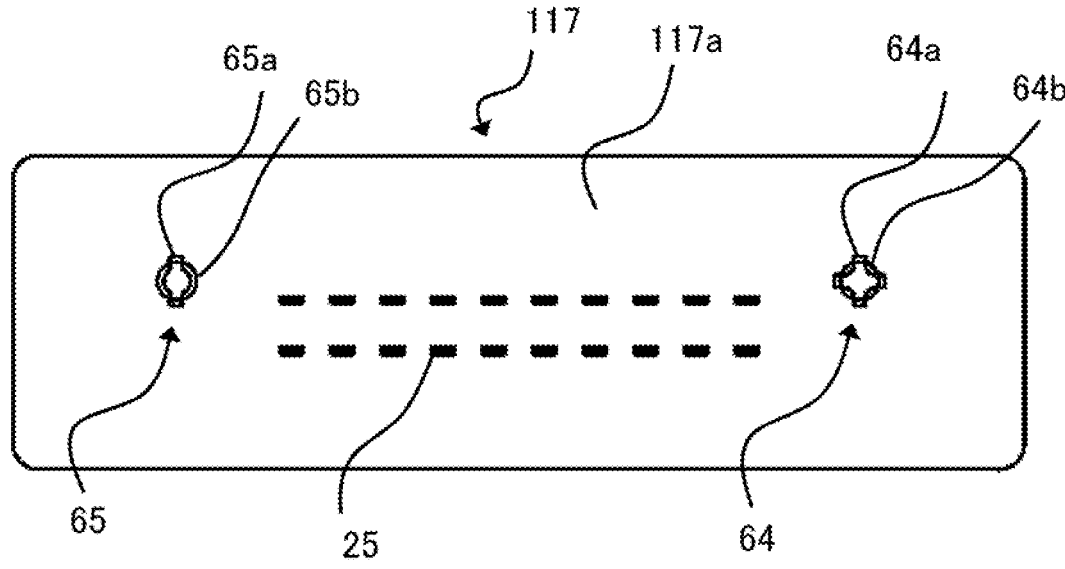
FIG. 18 is a front view of the connector of the circuit connection apparatus according to Embodiment 4, when viewed from a heat-sink mounting surface.

FIG. 17 is a perspective view of a connector 117 of the circuit connection apparatus 2 according to Embodiment 4, when viewed from a side facing a heat-sink mounting surface 117*a*. FIG. 18 is a front view of the connector 117, when viewed from the side facing the heat-sink mounting surface 117*a*. A first protruding portion 64 and a second protruding portion 65 are provided on the heat-sink mounting surface 117*a* of the connector 117. The first protruding portion 64 has a cylindrical columnar portion 64*b* and four ribs 64*a* arranged on the circumference of the columnar portion 64*b* in such a way as to be spaced apart from and perpendicular to one another. The rib 64*a* extends in parallel with the axle of the cylindrical columnar portion 64*b*. The second protruding portion 65 has a cylindrical columnar portion 65*b* and two ribs 65*a* arranged on the circumference of the columnar portion 65*b* in such a way as to be spaced apart from and coaxially with each other. The rib 65*a* extends in parallel with the axle of the cylindrical columnar portion 65*b*.

A gradient portion 64*c* is provided at the front end of each of the cylindrical columnar portion 64*b* and the rib 64*a*; the diameter of the gradient portion 64*c* becomes smaller as the position thereof approaches the frontmost end. A gradient portion 65*c* is provided at the front end of each of the cylindrical columnar portion 65*b* and the rib 65*a*; the diameter of the gradient portion 65*c* becomes smaller as the position thereof approaches the frontmost end. Accordingly, it is facilitated that the first protruding portion 64 and the second protruding portion 65 are inserted into the respective penetration holes 36 of the heat sink 10. In addition, the first protruding portion 64 and the second protruding portion 65 each have a shape with which even when the rib 64*a* and the rib 65*a*, respectively, are sliced off at a time of insertion, foreign materials are hardly occur.

The respective shapes of the circuit board 11, the heat sink 10, and the board assembling tool 37 are the same as those in Embodiment 1. There will be explained effects that can be obtained by means of an apparatus configured in a foregoing manner.

In the connector assembling process, the connector 117 is inserted in a direction in which the heat-sink mounting surface 117*a* of the connector 117 and the connecter mounting surface 10*a* of the heat sink 10 make contact with each other. In the positioning of the connector 117 and the heat sink 10, the four ribs 64*a* provided in the first protruding portion 64 and the penetration hole 36 provided in the heat sink 10 restrict the plane-direction position of the connector 117. The two ribs 65*a* provided in the second protruding portion 65 of the connector 117 and the penetration hole 36 provided in the heat sink 10 restrict the rotation-direction position of the connector 117.

After that, the ribs 64*a* and 65*b* on the circumferences of the cylindrical columnar portions 64*b* and 65*b*, respectively, are press-fitted into the inner circumferences of the respective penetration holes 36 of the heat sink 10, so that the connector 17 is fixed. The number of the ribs 65*a* provided in the second protruding portion 65 is set to be smaller than that of the ribs 64*a* in the first protruding portion 64 and the second protruding portion 65 does not completely fix the connector 17 so that play is provided for the respective positional deviations of the first protruding portion 64, the second protruding portion 65, and the penetration hole 36; thus, even when the positional deviation occurs, the connector 17 is prevented from floating. Moreover, the respective diameters of the ribs 64*a* and 65*b* are set in such a way that the press-fitting load at a time when each of the ribs 64*a* and 65*b* is press-fitted becomes smaller than the press-fitting load on the press-fit terminal 25.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the specification of the present disclosure. For example, at least one of the constituent components may be modified, added, or eliminated; moreover, at least one of the constituent components mentioned in at least one of the preferred embodiments may be selected and combined with the constituent components mentioned in another preferred embodiment.

DESCRIPTION OF REFERENCE NUMERALS

1: electric rotating machine, 2: circuit connection apparatus, 10, 110, 210: heat sink, 10a, 110a: connecter mounting surface, 10b, 210b: circuit-board mounting surface, 11: circuit board, 11a: board heat-sink mounting surface, 11b: board heat-sink non-mounting surface, 16: housing, 17: connector, 17a: heat-sink mounting surface, 17b: connector insertion/extraction side surface, 28: penetration hole, 29: power-source terminal, 30: signal terminal, 32: positioning protruding portion, 35: opening, 36, 136, 236: penetration hole, 37, 137: board assembling tool, 37a: board assembling surface, 37b: board non-assembly surface, 39: tool positioning protruding portion, 41: first columnar portion, 42: second columnar portion, 43: intermediate tapered portion, 44: front-end tapered portion, 47: guide tool, 47a: heat-sink lower supporting surface, 48: concave portion, 49: front-end tapered portion, 50: guide protrusion, 51: stepped hole, 55: fixed protrusion, 58: board pressing portion, 59: front-end tapered portion, 61: stepped hole, 64: first protruding portion, 65: second protruding portion, 64a, 65a: rib, 64b, 65b: columnar portion, 64c, 65c: gradient portion, 100: electric rotating machine apparatus

The invention claimed is:

1. A circuit connection apparatus comprising:
a connector including
   a housing which has an opening portion and in which a connection terminal is contained,
   a positioning guide portion provided at an opposite side to the opening portion of the housing, and
   a press-fit terminal extended from the connection terminal;
a heat sink that has a guide receipt portion fitted with the positioning guide portion and an opening to be penetrated by the press-fit terminal and to which the housing is fixed; and
a circuit board that has a board positioning guide portion and a through-hole to which the press-fit terminal is pressure-bonded and that is fixed to a surface of the heat sink, opposite to a surface to which the housing is fixed, wherein the guide receipt portion of the heat sink is a penetration hole, wherein the board positioning guide portion of the circuit board is a board penetration hole concentric with the penetration hole, and wherein a diameter of the board penetration hole of the circuit board is larger than a diameter of the penetration hole of the heat sink.

2. The circuit connection apparatus according to claim 1, wherein the positioning guide portion of the connector is a protruding portion and the press-fit terminal thereof is extended in parallel with the protruding portion.

3. The circuit connection apparatus according to claim 2, wherein in the connector, the length from a front end of the protruding portion to the surface of the heat sink, to which the housing is fixed, is longer than the length from the front end of the press-fit terminal to the surface, of the circuit board, that is fixed to the heat sink.

4. The circuit connection apparatus according to claim 2, wherein the heat sink has a stepped hole in the penetration hole at a position close to the surface thereof to which the housing is fixed; a diameter of the stepped hole is larger than a diameter of the penetration hole.

5. The circuit connection apparatus according to claim 2, wherein the heat sink has a stepped hole in the penetration hole at a position close to a surface opposite to the surface thereof to which the housing is fixed; a diameter of the stepped hole is larger than a diameter of the penetration hole.

6. The circuit connection apparatus according to claim 1, wherein in the connector includes another positioning guide portion at an opposite side to the opening portion of the housing, and the respective positioning guide portions are provided at opposite sides of the press-fit terminal in such a way that the press-fit terminal is sandwiched therebetween.

7. The circuit connection apparatus according to claim 1, wherein the connector has a first positioning protruding portion in which a columnar portion and four ribs parallel to an axle of the columnar portion are provided and a second positioning protruding portion in which a columnar portion and two ribs parallel to an axle of the columnar portion are provided.

8. The circuit connection apparatus according to claim 7, wherein the respective diameters of the columnar portion and the ribs in the connector become smaller, as the positions thereof approach a front end of the positioning protruding portion.

9. The circuit connection apparatus according to claim 1, wherein the circuit board is screwed to the heat sink.

10. The circuit connection apparatus according to claim 1, wherein the connector is screwed to the heat sink.

11. An electric rotating machine apparatus provided with the circuit connection apparatus according to claim 1.

* * * * *